(12) United States Patent
Yang et al.

(10) Patent No.: US 11,791,347 B2
(45) Date of Patent: Oct. 17, 2023

(54) LIGHT-EMITTING SUBSTRATE AND DISPLAY DEVICE

(71) Applicant: BOE Technology Group Co., Ltd., Beijing (CN)

(72) Inventors: Ming Yang, Beijing (CN); Zhenyu Zhang, Beijing (CN); Minghua Xuan, Beijing (CN); Feifei Wang, Beijing (CN); Xinhong Lu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/781,850

(22) PCT Filed: May 17, 2021

(86) PCT No.: PCT/CN2021/094028
§ 371 (c)(1),
(2) Date: Jun. 2, 2022

(87) PCT Pub. No.: WO2021/249120
PCT Pub. Date: Dec. 16, 2021

(65) Prior Publication Data
US 2023/0028746 A1    Jan. 26, 2023

(30) Foreign Application Priority Data
Jun. 12, 2020 (CN) .......................... 202010536696.5

(51) Int. Cl.
*G09G 3/32* (2016.01)
*G09G 3/34* (2006.01)
(Continued)

(52) U.S. Cl.
CPC ............. *H01L 27/124* (2013.01); *G09G 3/32* (2013.01); *G09G 3/3258* (2013.01); *G09G 3/34* (2013.01);
(Continued)

(58) Field of Classification Search
CPC ...... G09G 3/32; G09G 3/3233; G09G 3/3241; G09G 3/325; G09G 3/3258; G09G 3/3283;
(Continued)

(56) References Cited

U.S. PATENT DOCUMENTS 8,502,808 B2 * 8/2013 Handa ...................... G09G 3/30
345/206
8,610,869 B2 12/2013 Wang et al.
(Continued)

FOREIGN PATENT DOCUMENTS

CN       104934458 A     9/2015
CN       108287436 A     7/2018
(Continued)

OTHER PUBLICATIONS

Liu Shuai et al: Explaining Narrow Bezel Thin Design Solutions for LCD Products, Electronic World, 2013(24).
(Continued)

*Primary Examiner* — Vijay Shankar
(74) *Attorney, Agent, or Firm* — Banner & Witcoff, Ltd.

(57) ABSTRACT

A light-emitting substrate and a display device are provided. Each light-emitting unit includes a first voltage terminal. The first voltage line includes a first portion, a first connecting portion, and a second portion. The first portion is electrically connected with first voltage terminals of a first row to a Y-th row of light-emitting units in a corresponding column. An extension direction of a second portion of the first voltage line has an included angle with both the first direction and the second direction. The first connecting portion is at boundary of the Y-th row and a (Y+1)-th row of light-emitting units. The first transmission line is electrically connected with first voltage terminals of the (Y+1)-th row to an N-th row of light-emitting units in a corresponding column, and is electrically connected with the first connecting portion of the first voltage line corresponding to light-emitting units of a corresponding column.

20 Claims, 8 Drawing Sheets

(51) Int. Cl.
*H01L 27/12* (2006.01)
*H01L 25/16* (2023.01)
*G09G 3/3258* (2016.01)

(52) U.S. Cl.
CPC ......... *G09G 3/3413* (2013.01); *G09G 3/3426* (2013.01); *H01L 25/167* (2013.01); *G09G 2320/0233* (2013.01); *G09G 2320/0626* (2013.01)

(58) Field of Classification Search
CPC .. G09G 3/3291; G09G 3/3406; G09G 3/3413; G09G 3/342; G09G 3/3426; G09G 2320/0233; G09G 2320/0626; G09G 2300/0426; G02F 1/1336; G02F 1/133603; G02F 1/133612; H01L 27/124; H01L 25/167
See application file for complete search history.

(56) References Cited

U.S. PATENT DOCUMENTS

| | | | | |
|---|---|---|---|---|
| 9,123,681 | B2* | 9/2015 | Xi | ........................ H10K 59/131 |
| 10,475,876 | B2* | 11/2019 | Bower | ................. H10K 59/129 |
| 10,771,157 | B2 | 9/2020 | Deng et al. | |
| 10,978,493 | B2 | 4/2021 | Ma et al. | |
| 11,054,686 | B2 | 7/2021 | Fu | |
| 11,069,668 | B2* | 7/2021 | Hsu | ........................... G09G 3/32 |
| 11,488,987 | B2 | 11/2022 | Liu et al. | |
| 2010/0053131 | A1* | 3/2010 | Handa | .................... H10K 59/88 |
| | | | | 345/206 |

FOREIGN PATENT DOCUMENTS

| | | |
|---|---|---|
| CN | 108321281 A | 7/2018 |
| CN | 109413233 A | 3/2019 |
| CN | 109450539 A | 3/2019 |
| CN | 109585462 A | 4/2019 |
| CN | 109817658 A | 5/2019 |
| CN | 109949711 A | 6/2019 |
| CN | 110286534 A | 9/2019 |
| CN | 110503898 A | 11/2019 |
| EP | 2978286 A1 | 1/2016 |

OTHER PUBLICATIONS

Qing Chang et al: Study on Key Technologies of Mobile Phone Display Screen with TFT-LCD Narrow Boarder, A Master thesis submitted to University of Electronic Science and Technology of China, English Abstract.

Fu Ying et al: Patent Technology Analysis of LCD Display with Narrow Frame, Science and Technology Information of China,2016(14).

\* cited by examiner

LIGHT-EMITTING SUBSTRATE AND DISPLAY DEVICE

The application is a U.S. National Phase Entry of International Application PCT/CN2021/094028 filed on May 17, 2021, designating the United States of America and claiming priority to Chinese Patent Application No. 202010536696.5, filed on Jun. 12, 2020. The present application claims priority to and the benefit of the above-identified applications and the above-identified applications are incorporated by reference herein in their entirety.

TECHNICAL FIELD

Embodiments of the present disclosure relate to a light-emitting substrate and a display device.

BACKGROUND

With development of light-emitting diode technologies, backlights adopting light-emitting diodes of sub-millimeter scale or even micrometer scale are widely applied, which, thus, can not only allow a picture contrast of, for example, a transmissive display product adopting the backlight to reach a level of an organic light-emitting diode (OLED) display product, but also allow the product to retain technical advantages of a liquid crystal display (LCD), thereby improving the display effect of the picture and providing users with better visual experience.

SUMMARY

At least one embodiment of the present disclosure provides a light-emitting substrate, which comprises a plurality of light-emitting units, a plurality of first voltage lines, and a plurality of first transmission lines. The plurality of light-emitting units are arranged in an N*M array with N rows and M columns along the first direction and the second direction, the first direction and the second direction intersect with each other, and each of the plurality of light-emitting units comprises a first voltage terminal; the plurality of first voltage lines are in one-to-one correspondence with a plurality of columns of light-emitting units, and are configured to transmit a first voltage signal, and a first voltage line of the plurality of first voltage lines comprises a first portion, a first connecting portion, and a second portion connected sequentially; the first portion extends along the second direction and is electrically connected with first voltage terminals of a first row of light-emitting units to a Y-th row of light-emitting units in a corresponding column; an extension direction of a second portion of at least one first voltage line among the plurality of first voltage lines has an included angle with both the first direction and the second direction; the first connecting portion is at a boundary of the Y-th row of light-emitting units and a (Y+1)-th row of light-emitting units, and is configured to allow the first portion to be electrically connected to the second portion; the plurality of first transmission lines are in one-to-one correspondence with the plurality of columns of light-emitting units, a first transmission line of the plurality of first transmission lines is electrically connected with first voltage terminals of the (Y+1)-th row of light-emitting units to an N-th row of light-emitting units in a corresponding column, and is electrically connected with the first connecting portion of the first voltage line corresponding to light-emitting units of a corresponding column; and N is an integer greater than 0, M is an integer greater than 0, and 0<Y<N and Y is an integer.

For example, the light-emitting substrate provided by an embodiment of the present disclosure further comprises a plurality of second voltage lines and a plurality of second transmission lines. Each of the plurality of light-emitting units further comprises a second voltage terminal, the plurality of second voltage lines are in one-to-one correspondence with the plurality of columns of light-emitting units, and are configured to transmit a second voltage signal, a second voltage line of the plurality of second voltage lines comprises a third portion, a second connecting portion, and a fourth portion connected sequentially, the third portion extends along the second direction and is electrically connected with second voltage terminals of the first row of light-emitting units to the Y-th row of light-emitting units in the corresponding column, an extension direction of a fourth portion of at least one second voltage line among the plurality of second voltage lines has an included angle with both the first direction and the second direction, the second connecting portion is at a boundary between the Y-th row of light-emitting units and the (Y+1)-th row of light-emitting units, and is configured to allow the third portion to be electrically connected to the fourth portion, the plurality of second transmission lines are in one-to-one correspondence with the plurality of columns of light-emitting units, a second transmission line of the plurality of second transmission lines is electrically connected with second voltage terminals of the (Y+1)-th row of light-emitting units to the N-th row of light-emitting units in the corresponding column, and is electrically connected with the second connecting portion of the second voltage line corresponding to light-emitting units of a corresponding column.

For example, in the light-emitting substrate provided by an embodiment of the present disclosure, Y=N-1 or Y=N-2.

For example, in the light-emitting substrate provided by an embodiment of the present disclosure, the first voltage line and the first transmission line are in different film layers, and the different film layers are insulated from each other in positions where there is no via hole provided.

For example, in the light-emitting substrate provided by an embodiment of the present disclosure, the second voltage line and the second transmission line are in different film layers, and the different film layers are insulated from each other in positions where there is no via hole provided.

For example, in the light-emitting substrate provided by an embodiment of the present disclosure, the first voltage line and the second voltage line are in a same layer, and the first transmission line and the second transmission line are in a same layer.

For example, in the light-emitting substrate provided by an embodiment of the present disclosure, the first voltage signal is a driving voltage signal, the second voltage signal is a common voltage signal, and a level of the first voltage signal is greater than a level of the second voltage signal; or the first voltage signal is the common voltage signal, the second voltage signal is the driving voltage signal, and the level of the first voltage signal is lower than the level of the second voltage signal.

For example, the light-emitting substrate provided by an embodiment of the present disclosure further comprises a bonding region. The bonding region is at an edge of the light-emitting substrate that is close to the N-th row of light-emitting units, the bonding region comprises a plurality of bonding pins, the second portion of the first voltage line is electrically connected with at least one of the plurality of bonding pins, and the fourth portion of the second voltage line is electrically connected with at least one of the plurality of bonding pins.

For example, in the light-emitting substrate provided by an embodiment of the present disclosure, a width of the first portion of the first voltage line in the first direction is greater than a width of the first transmission line in the first direction, a width of the fourth portion of the second voltage line in the first direction is greater than a width of the second transmission line in the first direction.

For example, in the light-emitting substrate provided by an embodiment of the present disclosure, at least one first transmission line among the plurality of first transmission lines extends along the second direction, and at least one second transmission line among the plurality of second transmission lines extends along the second direction.

For example, the light-emitting substrate provided by an embodiment of the present disclosure further comprises a plurality of third voltage lines and a plurality of fourth voltage lines extending along the first direction. Orthogonal projections of the plurality of third voltage lines on a plane parallel to the light-emitting substrate overlap with orthogonal projections of the plurality of first voltage lines on the plane parallel to the light-emitting substrate, and the plurality of third voltage lines are electrically connected with the plurality of first voltage lines through via holes; orthogonal projections of the plurality of fourth voltage lines on the plane parallel to the light-emitting substrate overlap with orthogonal projections of the plurality of second voltage lines on the plane parallel to the light-emitting substrate, and the plurality of fourth voltage lines are electrically connected with the plurality of second voltage lines through via holes; and the plurality of third voltage lines and the plurality of fourth voltage lines are in a same layer.

For example, in the light-emitting substrate provided by an embodiment of the present disclosure, each of the plurality of light-emitting units further comprises a driving circuit and a plurality of light-emitting elements; the driving circuit comprises a first input terminal, a second input terminal, an output terminal, and a common voltage terminal; the common voltage terminal is electrically connected with the second voltage terminal; the plurality of light-emitting elements are connected in series sequentially and are connected between the first voltage terminal and the output terminal; and the driving circuit is configured to output a relay signal through the output terminal within a first period according to a first input signal received by the first input terminal and a second input signal received by the second input terminal, and provide a driving signal to the plurality of light-emitting elements sequentially connected in series through the output terminal within a second period.

For example, in the light-emitting substrate provided by an embodiment of the present disclosure, the plurality of light-emitting elements comprise a plurality of micro light-emitting diodes.

At least one embodiment of the present disclosure further provides a display device, which comprises: a display panel; and the light-emitting substrate provided by any embodiment of the present disclosure. The display panel has a display side and a non-display side opposite to the display side, and the light-emitting substrate is on the non-display side of the display panel to serve as a backlight unit.

BRIEF DESCRIPTION OF THE DRAWINGS

In order to clearly illustrate the technical solution of the embodiments of the present disclosure, the drawings of the embodiments will be briefly described in the following. It is obvious that the described drawings in the following are only related to some embodiments of the present disclosure and thus are not limitative of the present disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first", "second", etc., which are used in the description and the claims of the present application for disclosure, are not intended to indicate any sequence, amount or importance, but distinguish various components. The terms "comprise", "comprising", "include", "including", etc., are intended to specify that the elements or the objects stated before these terms encompass the elements or the objects and equivalents thereof listed after these terms, but do not preclude the other elements or objects. The phrases "connect", "connected", "coupled", etc., are not intended to define a physical connection or mechanical connection, but may include an electrical connection, directly or indirectly. "On", "under", "right", "left" and the like are only used to indicate relative position relationship, and when the position of the object which is described is changed, the relative position relationship may be changed accordingly.

Among display products adopting light-emitting diodes, mini light-emitting diodes (Mini-LEDs) or micro light-emitting diodes (Micro-LEDs) have small sizes and high brightness, and may be widely applied to backlight modules of display devices, and the backlight can be finely adjusted, so as to implement display of high-dynamic range (HDR) images. Of course, the Mini-LEDs and the Micro-LEDs may also be directly used as pixels and applied to display panels of display devices for display. For example, a typical size (e.g., a length) of a Micro-LED is less than 50 microns, e.g., ranging from 10 microns to 50 microns; and a typical size (e.g., a length) of a Mini-LED ranges from 50 microns to 150 microns, e.g., from 80 microns to 120 microns.

Figure 1A:
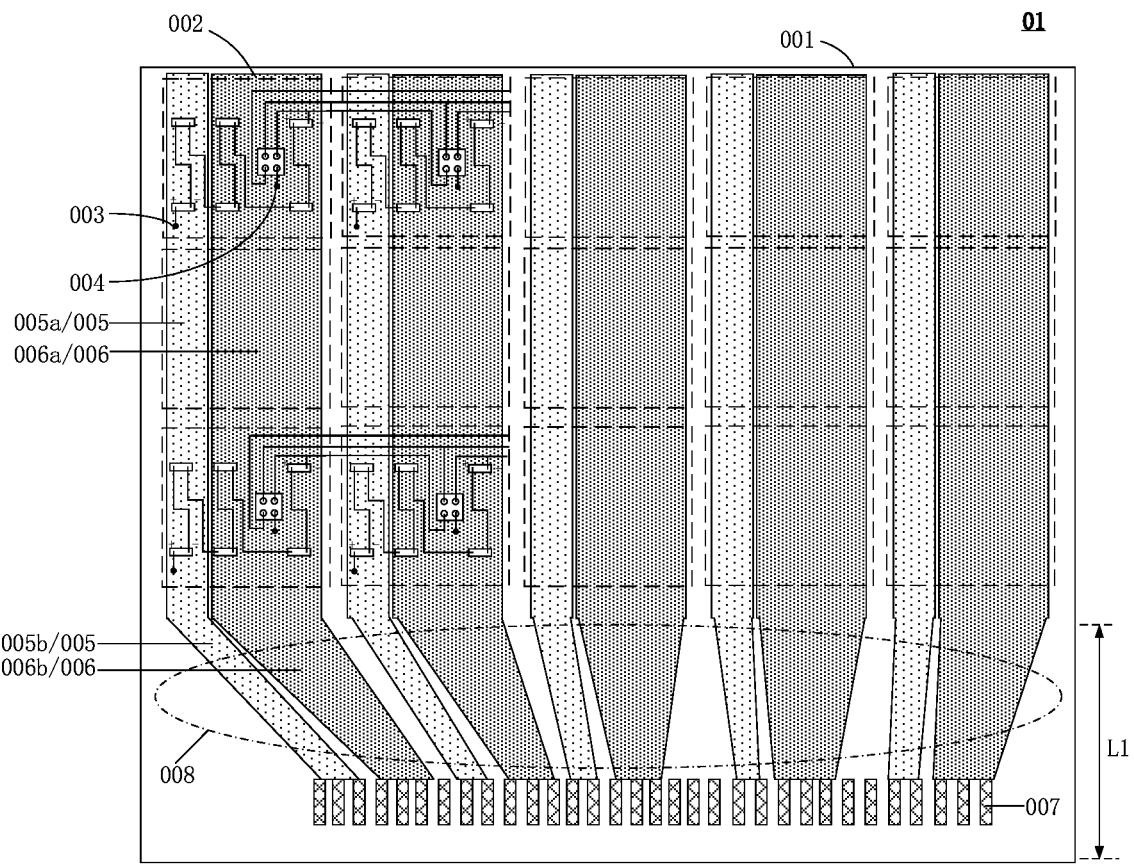
FIG. 1A is a schematic plane view of a light-emitting substrate.

FIG. 1A is a schematic plane view of a light-emitting substrate. As shown in FIG. 1A, in a light-emitting substrate 01, a plurality of light-emitting units 002 are provided on a base substrate 001. For example, each light-emitting unit 002 includes a driving circuit and a plurality of light-emitting elements. In order to make the light-emitting element emit light, a first voltage signal needs to be provided to a first voltage terminal 003 of each light-emitting unit 002, and a second voltage signal needs to be provided to a second voltage terminal 004 of each light-emitting unit 002. For example, the first voltage signal and the second voltage signal are a driving voltage signal and a common voltage signal, respectively; or, the first voltage signal and the second voltage signal are a common voltage signal and a driving voltage signal, respectively.

A plurality of first voltage lines 005 and a plurality of second voltage lines 006 extend along a column direction for respectively providing a first voltage signal and a second voltage signal. The first voltage terminal 003 of each light-emitting unit 002 is electrically connected with a first voltage line 005; and the second voltage terminal 004 of each light-emitting unit 002 is electrically connected with a second voltage line 006. A plurality of bonding pins 007 are provided on an edge of the light-emitting substrate 01; and the first voltage line 005 and the second voltage line 006 need to be electrically connected with different bonding pins 007 in order to receive a driving voltage signal and a common voltage signal provided by a control circuit or a chip bonded to the bonding pins 007.

Because a width of each bonding pin 007 does not belong to a same size order as a width of the first voltage line 005 and a width of the second voltage line 006, a distance between two adjacent bonding pins 007 among the plurality of bonding pins 007 is smaller, and the first voltage line 005 and the second voltage line 006 respectively need to be electrically connected with the respective light-emitting units 002 and the bonding pins 007 at the same time, the first voltage line 005 and the second voltage line 006 cannot extend completely in a straight line. That is, as shown in FIG. 1A, the first voltage line 005 includes a first portion 005*a* and a second portion 005*b*. The first portion 005*a* extends in a column direction, and extends from a first row of light-emitting units 002 to a last row of light-emitting units 002. The second portion 005*b* is an oblique wiring, and extends from an outer side of the last row of light-emitting units 002 all the way to the bonding pins 007 at an edge of the base substrate 001. Similarly, the second voltage line 006 includes a first portion 006*a* and a second portion 006*b*. The first portion 006*a* extends in the column direction, and extends from the first row of light-emitting units 002 to the last row of light-emitting units 002. The second portion 006*b* is an oblique wiring, and extends from the outer side of the last row of light-emitting units 002 all the way to the bonding pins 007 at the edge of the base substrate 001.

According to the above-described design criteria, the light-emitting substrate 01 needs to reserve an oblique wiring region 008, so a width L1 of a non-display region of the light-emitting substrate 01 (e.g., a lower frame in FIG. 1A) is relatively large, which is not favorable for implementing narrow frame design.

It should be noted that, the wiring mode in the oblique wiring region 008 in FIG. 1A is only illustrative and not limitative; and the specific wiring mode in the oblique wiring region 008 in FIG. 1A may be any applicable mode, which may be determined according to actual needs, and is not limited in the embodiments of the present disclosure.

Figure 1B:
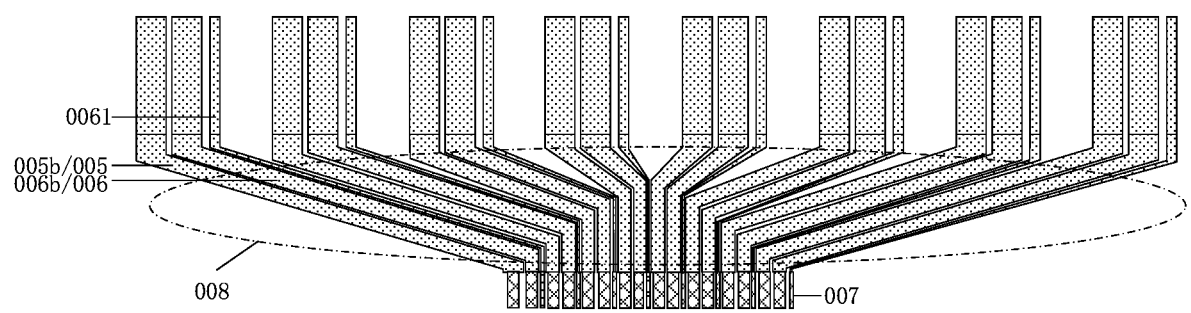
FIG. 1B is a partial schematic plane view of a light-emitting substrate.

FIG. 1B is a partial plane view of a light-emitting substrate. FIG. 1B shows another wiring mode in the oblique wiring region 008 in the light-emitting substrate, and the wiring mode is different from the wiring mode in the oblique wiring region 008 shown in FIG. 1A. Other structures of the light-emitting substrate shown in FIG. 1B are substantially the same as those of the light-emitting substrate shown in FIG. 1A, so the same structures are no longer illustrated.

For example, as shown in FIG. 1B, in the oblique wiring region 008, the second portion 005*b* is basically an oblique wiring, but the portion connected with the bonding pin 007 is no longer an oblique wiring, and the portion connected with the bonding pin 007 extends in the column direction, that is, the second portion 005*b* extends obliquely to the vicinity of the bonding pin 007, and then turns to extend in the column direction and is electrically connected with the bonding pin 007. Similarly, the second portion 006*b* extends obliquely to the vicinity of the bonding pin 007, and then turns to extend in the column direction and is electrically connected with the bonding pin 007. For example, sizes of the plurality of bonding pins 007 may be different in order to match widths of correspondingly connected wirings. For example, in the light-emitting substrate, the voltage lines are not limited to include the first voltage line 005 and the second voltage line 006, but may also include more voltage lines, for example, may also include additional voltage lines 0061, which may be determined according to actual needs, and may not be limited by the embodiments of the present disclosure.

Similarly, the oblique wiring region 008 needs to be reserved in the light-emitting substrate shown in FIG. 1B, so the width of the non-display region of the light-emitting substrate (e.g., the lower frame of the light-emitting substrate shown in FIG. 1B) is relatively large, which is not favorable for implementing narrow frame design.

At least one embodiment of the present disclosure provides a light-emitting substrate and a display device. The light-emitting substrate can effectively reduce the width of the non-display region and the size of the non-display region, which is favorable for implementing narrow frame design.

Hereinafter, the embodiments of the present disclosure are described in detail with reference to the accompanying drawings. It should be noted that, same reference signs are used in different drawings to refer to same elements that have been described.

At least one embodiment of the present disclosure provides a light-emitting substrate. The light-emitting substrate includes a plurality of light-emitting units, a plurality of first voltage lines, and a plurality of first transmission lines. The plurality of light-emitting units are arranged in an N*M array with N rows and M columns along the first direction and the second direction; the first direction and the second direction intersect with each other; and each of the plurality of light-emitting units includes a first voltage terminal. The plurality of first voltage lines are in one-to-one correspondence with the plurality of columns of light-emitting units, and are configured to transmit a first voltage signal. The first voltage line includes a first portion, a first connecting portion, and a second portion connected sequentially. The first portion extends along the second direction and is electrically connected with first voltage terminals of a first row of light-emitting units to a Y-th row of light-emitting units in a corresponding column. An extension direction of a second portion of at least one first voltage line among the plurality of first voltage lines has an included angle with both the first direction and the second direction. The first connecting portion is located at a boundary of the Y-th row of light-emitting units and a (Y+1)-th row of light-emitting units, and is configured to allow the first portion to be electrically connected to the second portion. The plurality of first transmission lines are in one-to-one correspondence with the plurality of columns of light-emitting units. The first transmission line is electrically connected with first voltage terminals of the (Y+1)-th row of light-emitting units to an N-th row of light-emitting units in a corresponding column, and is electrically connected with a first connecting portion of a first voltage line corresponding to the light-emitting units of a corresponding column, where N is an integer greater than 0, M is an integer greater than 0, 0<Y<N and Y is an integer.

Figure 2:
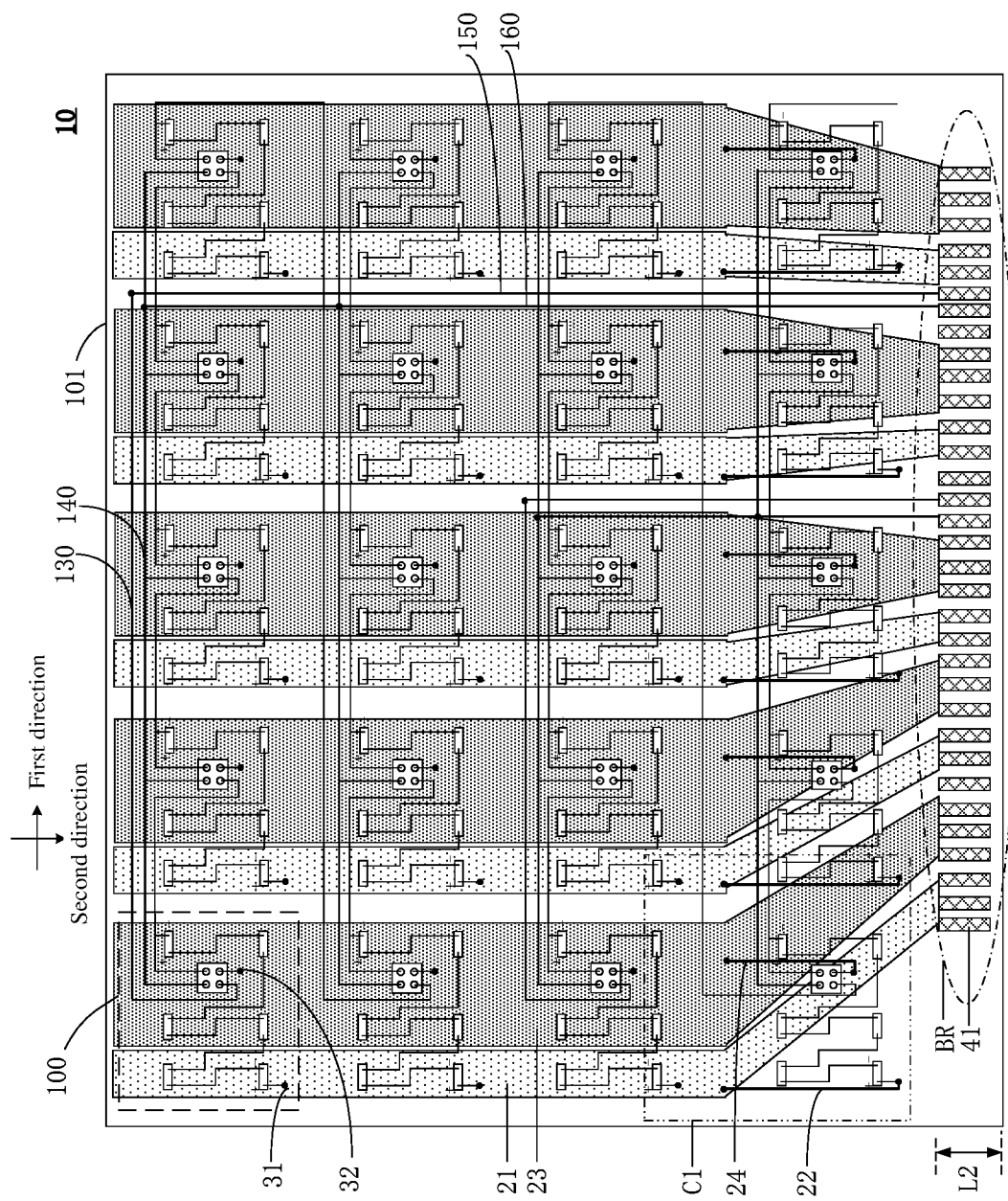
FIG. 2 is a schematic plane view of a light-emitting substrate provided by some embodiments of the present disclosure.
Figure 3:
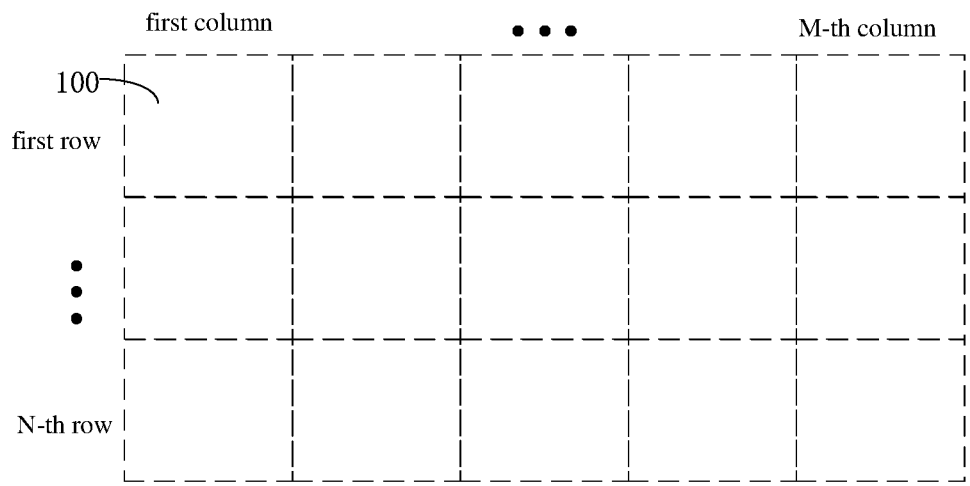
FIG. 3 is a schematic diagram of arrangement of light-emitting units of the light-emitting substrate shown in FIG. 2.

FIG. 2 is a schematic plane view of a light-emitting substrate provided by some embodiments of the present disclosure, and FIG. 3 is a schematic diagram of arrangement of light-emitting units of the light-emitting substrate shown in FIG. 2. As shown in FIG. 2 and FIG. 3, the light-emitting substrate 10 includes a base substrate 101, a plurality of light-emitting units 100 arranged in an array on the base substrate 101, and a plurality of first voltages 21 and a plurality of first transmission lines 22 arranged on the base substrate 101.

For example, the plurality of light-emitting units 100 are arranged in an N*M array with N rows and M columns along the first direction and the second direction, where N is an integer greater than 0, and M is an integer greater than 0. For example, the first direction and the second direction intersect with each other. For example, in some examples, each row of light-emitting units 100 are arranged in a first direction, each column of light-emitting units 100 are arranged in a second direction, the first direction is perpendicular to the second direction, the first direction is a row direction, and the second direction is a column direction. Of course, the embodiments of the present disclosure are not limited thereto, and the first direction and the second direction may be any directions, as long as the first direction and the second direction intersect with each other.

For example, the plurality of light-emitting units 100 are not limited to be arranged in a straight line, but may also be arranged in a curved line, or arranged in a circle, or arranged in an arbitrary manner, which may be determined according to actual needs, and is not limited by the embodiments of the present disclosure. For example, the amount of light-emitting units 100 may be determined according to actual needs, for example, according to the size of the light-emitting substrate 10 and required brightness. Although FIG. 2 shows light-emitting units 100 in four rows and five columns, it should be understood that the amount of light-emitting units 100 is not limited thereto. For example, the base substrate 101 may be a plastic substrate, a silicon substrate, a ceramic substrate, a glass substrate, a quartz substrate, etc. The base substrate 101 includes a single-layer circuit or a multi-layer circuit, which is not limited by the embodiments of the present disclosure.

Figure 4:
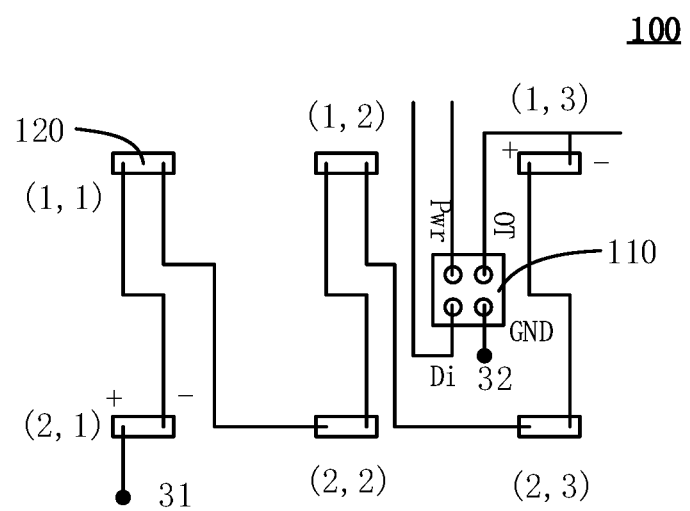
FIG. 4 is a schematic diagram of one light-emitting unit in the light-emitting substrate shown in FIG. 2.

FIG. 4 is a schematic diagram of one light-emitting unit of the light-emitting substrate shown in FIG. 2. For example, as shown in FIG. 4, with respect to a plurality of light-emitting units 100, each light-emitting unit 100 includes a driving circuit 110, a plurality of light-emitting elements 120, a first voltage terminal 31 and a second voltage terminal 32.

The driving circuit 110 includes a first input terminal Di, a second input terminal Pwr, an output terminal OT and a common voltage terminal GND. The first input terminal Di receives a first input signal; and the first input signal is, for example, an address signal, for gating a driving circuit 110 of a corresponding address. For example, addresses of different driving circuits 110 may be the same or different. The first input signal may be an 8-bit address signal; and the address to be transmitted can be obtained by parsing the address signal. The second input terminal Pwr receives a second input signal; and the second input signal is, for example, a power line carrier communication signal. For example, the second input signal not only supplies power to the driving circuit 110, but also transmits communication data to the driving circuit 110; and the communication data can be used to control light emission duration of a corresponding light-emitting unit 100, thereby controlling visual light emission brightness thereof. The output terminal OT can respectively output different signals in different periods, for example, respectively output a relay signal and a driving signal. For example, the relay signal is an address signal supplied to other driving circuit 110, that is, a first input terminal Di of the other driving circuit 110 receives the relay signal as the first input signal, thereby obtaining the address signal. For example, the driving signal may be a driving current for driving the light-emitting element 120 to emit light. The common voltage terminal GND receives a common voltage signal, for example, a ground signal. For example, the common voltage terminal GND is electrically connected with the second voltage terminal 32.

The driving circuit 110 is configured to output a relay signal through the output terminal OT within the first period according to the first input signal received by the first input terminal Di and the second input signal received by the second input terminal Pwr, and provide a driving signal to the plurality of light-emitting elements 120 sequentially connected in series through the output terminal OT within the second period. During the first period, the output terminal OT outputs a relay signal, and the relay signal is provided to the other driving circuit 110 so that the other driving circuit 110 obtains the address signal. During the second period, the output terminal OT outputs a driving signal, and the driving signal is provided to the plurality of light-emitting elements 120 sequentially connected in series, so that the light-emitting elements 120 emit light during the second period.

For example, the first period and the second period are different periods; and the first period may be, for example, earlier than the second period. The first period may be continuously connected with the second period, and an end moment of the first period is a start moment of the second period; or, there may also be other period between the first period and the second period, the other period may be used to implement other required functions; or the other period may also be used only to separate the first period and the second period, so as to prevent the signals of the output terminal OT from interfering with each other in the first period and the second period.

For example, the plurality of light-emitting elements 120 are sequentially connected in series and are connected between the first voltage terminal 31 and the output terminal OT. For example, the plurality of light-emitting elements 120 may include a plurality of micro light-emitting diodes (Micro-LED) or a plurality of mini light-emitting diodes (Mini-LED), that is, any one light-emitting element 120 may be a Micro-LED or a Mini-LED. For example, each light-emitting element 120 includes a positive electrode (+) and a negative electrode (−) (or may also be referred to as an anode and a cathode); positive electrodes and negative electrodes of the plurality of light-emitting elements 120 are sequentially connected in series head to tail, so that a current path is formed between the first voltage terminal 31 and the output terminal OT. The first voltage terminal 31 supplies a driving voltage signal, for example, a high voltage in a period that needs to make the light-emitting element 120 emit light (the second period), and a low voltage in other period. Therefore, in the second period, the driving voltage signal (e.g., the driving current) sequentially flows from the first voltage terminal 31 through the plurality of light-emitting elements 120, and then flows into the output terminal OT of the driving circuit 110. The plurality of light-emitting elements 120 emit light when the driving current flows; by controlling duration of the driving current, light emission duration of the light-emitting elements 120 may be controlled, thereby controlling visual light emission brightness.

For example, as shown in FIG. 4, in some examples, one light-emitting unit 100 includes six light-emitting elements 120; and the six light-emitting elements 120 are arranged in 2 rows and 3 columns. For example, the six light-emitting elements 120 are sequentially numbered as (1, 1), (1, 2), (1, 3), (2, 1), (2, 2) and (2, 3) from left to right and from top to bottom; and numbers are shown in FIG. 4. For example, when six light-emitting elements 120 are connected in series, the light-emitting element 120 in position (2, 1) is used as a starting point of the series connection, and the light-emitting elements 120 in positions (1, 1), (2, 2), (1, 2), (2, 3) and (1, 3) are sequentially connected, and the light-emitting element 120 in position (1, 3) is used as an end point of the series connection. For example, a positive electrode of the light-emitting element 120 in position (2, 1) is connected with the first voltage terminal 31, and a negative electrode of the light-emitting element 120 in position (1, 3) is connected with the output terminal OT of the driving circuit 110. By adopting such a distribution mode and series connection mode, overlapping of wirings can be effectively avoided, which is convenient for design and preparation; moreover, a bending shape and a length of a wiring between any two adjacent light-emitting elements 120 on the series path are approximately the same, so that resistance of the wire itself is relatively balanced, which can improve load balance and improve stability of the circuit.

For example, in a same light-emitting unit 100, a plurality of (e.g., 6) light-emitting elements 120 are arranged in an array, so that light emission can be more uniform. The driving circuit 110 is located in a gap of the array formed by the plurality of light-emitting elements 120.

It should be noted that, in the embodiments of the present disclosure, the amount of light-emitting elements 120 in each light-emitting unit 100 is not limited, which may be any amount such as 4, 5, 7, 8, etc., and is not limited to 6. The plurality of light-emitting elements 120 may be arranged in an arbitrary manner, for example, arranged in a desired pattern, and is not limited to matrix. An arrangement position of the driving circuit 110 is not limited, and the driving circuit 110 may be arranged in any gap between the light-emitting elements 120, which may be determined according to actual needs, and is not limited by the embodiments of the present disclosure.

It should be noted that, the first voltage terminal 31 may receive the driving voltage signal and provide the driving voltage signal to the light-emitting element 120, or may also receive the common voltage signal and provide the common voltage signal to the light-emitting element 120, which may be determined according to an actual operation mode of the driving circuit 110 and the series connection mode of the plurality of light-emitting elements 120, and may not be limited by the embodiments of the present disclosure. For example, a level of the driving voltage signal is greater than a level of the common voltage signal; and the common voltage signal is, for example, a ground signal.

It should be noted that, the structure of the light-emitting unit 100 shown in FIG. 4 is only an example, and should not be construed as a limitation on the embodiments of the present disclosure. For example, in some other examples, the light-emitting unit 100 may only include the light-emitting element 120, and the driving circuit 110 is no longer required; in this case, a passive matrix (PM) driving mode may be adopted to drive the respective light-emitting elements 120. For example, in some further examples, a circuit including a thin film transistor (TFT) may also be provided in the light-emitting unit 100, and an active matrix (AM) driving mode may be adopted to perform active driving on the light-emitting element 120 by the circuit, and the circuit is, for example, a common pixel circuit and may also include devices such as capacitors, in which case, the foregoing driving circuit 110 may be omitted. The light-emitting unit 100 may also adopt any other suitable structure, which is not limited by the embodiments of the present disclosure.

Figure 5A:
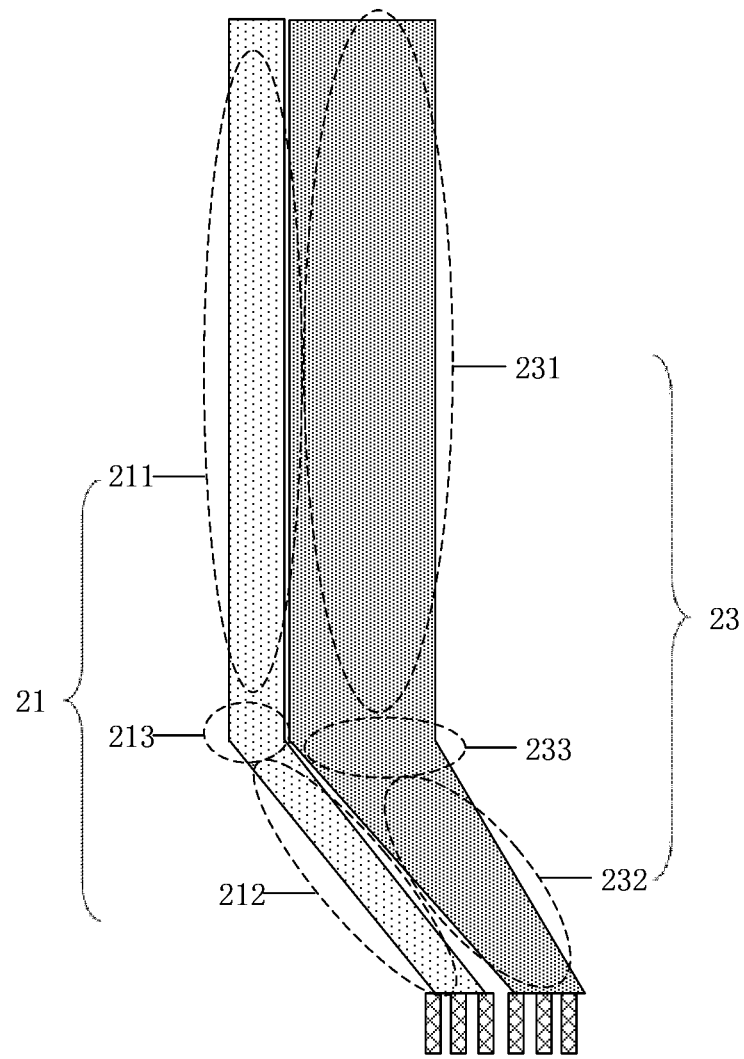
FIG. 5A is an enlarged schematic diagram of a first voltage line and a second voltage line of the light-emitting substrate shown in FIG. 2.
Figure 5B:
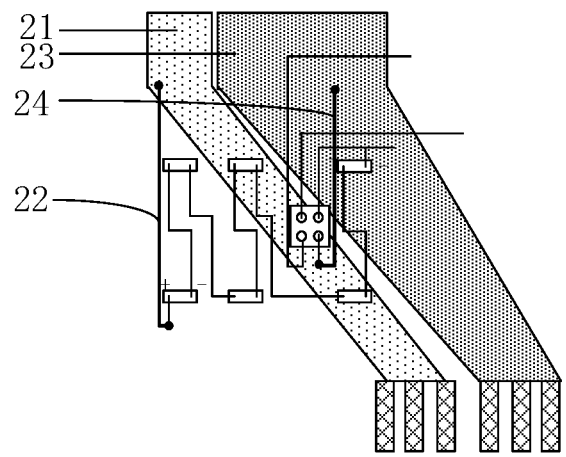
FIG. 5B is a schematic diagram of connection relationship of one light-emitting unit located in a last row with the first voltage line and the second voltage line in the light-emitting substrate shown in FIG. 2.

FIG. 5A is an enlarged schematic diagram of the first voltage line and the second voltage line of the light-emitting substrate shown in FIG. 2, and FIG. 5B is a schematic diagram of connection relationship of one light-emitting unit located in the last row with the first voltage line and the second voltage line in the light-emitting substrate shown in FIG. 2.

For example, as shown in FIG. 2, FIG. 5A and FIG. 5B, the plurality of first voltage lines 21 are in one-to-one correspondence with the plurality of columns of light-emitting units 100, and are configured to transmit the first voltage signal. For example, the first voltage signal is a driving voltage signal or a common voltage signal. The first voltage line 21 includes a first portion 211, a first connecting portion 213, and a second portion 212 which are connected sequentially. For example, with respect to a same first voltage line 21, a width of the first portion 211 along the first direction is greater than a width of the second portion 212 along the first direction. For example, with respect to a same first voltage line 21, widths of the first portion 211 in different positions along the first direction may be equal to each other, and widths of the second portion 212 in different positions along the first direction may be different from each other. For example, the width of the second portion 212 in the first direction, for example, gradually decreases, from an terminal connected with the first connecting portion 213 to an terminal connected with the bonding pin 41 (to be described later), that is, the second portion 212 is gradually narrowed to meet wiring design requirements.

For example, the first portion 211 extends along the second direction and is electrically connected with the first voltage terminals 31 of the first row of light-emitting units 100 to the Y-th row of light-emitting units 100 in a corresponding column, for example, through a via hole to realize electrical connection. In the example of FIG. 2, the first portion 211 is electrically connected with the first voltage terminals 31 of the first row of light-emitting units 100 to a third row of light-emitting units 100 in the corresponding column.

It should be noted that, the film layer where the first voltage line 21 in FIG. 2 is located is located on a side of the light-emitting element 120 that is closer to the base substrate 101, so the first portion 211 of the first voltage line 21 may extend below a positive electrode of the light-emitting element 120 in the light-emitting unit 100 that is close to the first voltage terminal 31, and is electrically connected with the positive electrode of the light-emitting element 120 through a via hole (i.e., electrically connected with the first voltage terminal 31), that is, the first voltage line 21 transmits the first voltage signal to the positive electrode of the light-emitting element 120 (i.e., transmits to the first voltage terminal 31). Although the negative electrode of the light-emitting element 120 overlaps with the first voltage line 21 in FIG. 2, because the two are located in different film layers, the negative electrode of the light-emitting element 120 is not electrically connected with the first voltage line 21.

An extension direction of a second portion 212 of at least one first voltage line 21 among the plurality of first voltage lines 21 has an included angle with both the first direction and the second direction. For example, the included angle may be greater than 0 degrees and less than 90 degrees (e.g., ranges from 20 to 70 degrees, form 40 to 60 degrees, or may be 45 degrees); and the included angle between the extension direction and the first direction and the included angle between the extension direction and the second direction may be the same or different. For example, in the example of FIG. 2, the second portion 212 of the at least one first voltage line 21 extends obliquely, that is, has an included angle with both the row direction and the column direction. It should be noted that, it may be that some first voltage lines 21 have the second portions 212 extend obliquely, or all the first voltage lines 21 have the second portions 212 extend obliquely, which may be determined according to actual wiring requirements, and is not limited by the embodiments of the present disclosure.

The first connecting portion 213 is located at a boundary between the Y-th row of light-emitting units 100 and the (Y+1)-th row of light-emitting units 100, and is configured to allow the first portion 211 to be electrically connected to the second portion 212, 0<Y<N and Y is an integer. For example, in the example of FIG. 2, the first connecting portion 213 is located at a boundary between the third row of light-emitting units 100 and the fourth row of light-emitting units 100, and in this case, Y=3, N=4, Y=N-1. For example, the first connecting portion 213 is actually a bent portion of the first voltage line 21, so that the extension direction of the first voltage line 21 is changed. It should be noted that, the region covered by the first connecting portion 213 is not limited; and the first connecting portion 213 may not only include the bent portion of the first voltage line 21, but may also include a portion of a line segment of the first voltage line 21 that extends in the second direction, or may also include a portion of an obliquely extending line segment of the first voltage line 21, which is not limited by the embodiments of the present disclosure.

The plurality of first transmission lines 22 are in one-to-one correspondence with the plurality of columns of light-emitting units 100. The first transmission line 22 is electrically connected with first voltage terminals 31 of the (Y+1)-th row of light-emitting units 100 to the N-th row of light-emitting units 100 in the corresponding column, and is electrically connected with the first connecting portion 213 of the first voltage line 21 corresponding to the light-emitting units 100 in the corresponding column. For example, in the example of FIG. 2, the first transmission line 22 is electrically connected with the first voltage terminals 31 of the fourth row of light-emitting units 100 of the corresponding column, and is electrically connected with the first connecting portion 213 of the first voltage line 21 corresponding to the light-emitting units 100 in the corresponding column, so that the first voltage terminals 31 of the fourth row of light-emitting units 100 are electrically connected with the first voltage line 21, so as to receive the first voltage signal supplied by the first voltage line 21. In this case, Y=3, N=4, and Y=N-1.

For example, the first voltage line 21 and the first transmission line 22 are located in different layers, so as to facilitate wiring. For example, electrical connection between the first voltage line 21 and the first transmission line 22 may be implemented through a via hole. Of course, the embodiments of the present disclosure are not limited thereto, and the first voltage line 21 and the first transmission line 22 may also be located in a same layer, as long as corresponding electrical connection can be implemented without short-circuiting with other structures. For example, a width of the first portion 211 of the first voltage line 21 in the first direction is greater than a width of the first transmission line 22 in the first direction.

It should be noted that, in the description of the present disclosure, being located in "different layers" refers to being located in different film layers, and these different film layers are insulated from each other in positions where there are no via holes provided. For example, when it is needed to electrically connect wirings located in different film layers (e.g., the first voltage line 21 and the first transmission line 22) with each other, the wirings located in different film layers may be electrically connected by arranging via holes. For example, these different film layers are prepared in different processes, for example, firstly, one of these different film layers is prepared by using a first process, and then another of these different film layers is prepared by using a second process. For example, after the first process and before the second process, an insulating layer may also be prepared by using a third process, and the insulating layer is located between different film layers, so that the different film layers are insulated from each other in the positions where there are no via holes provided. For example, the first process, the second process, and the third process may be the same or different. For example, in a direction perpendicular to the base substrate 101, distances from the different film layers to the base substrate 101 are different from each other. That is, among different film layers, one film layer is closer to the base substrate 101, and the other film layer is farther from the base substrate 101. In the following description, the above description may be referred to for the meaning of being in "different layers", and no details will be repeated here.

It should be noted that, in the description of the present disclosure, being in a "same layer" refers to being in a same one film layer. For example, wirings located in a same film layer may be prepared in a same process, for example, the desired wirings are formed by using one patterning process.

For example, in the direction perpendicular to the base substrate 101, distances from wirings located in a same film layer to the base substrate 101 are the same or substantially the same. That is, the distances from the wirings in the film layer to the base substrate 101 are the same or substantially the same. In the following description, the above description may be referred to for the meaning of being in a "same layer", and no details will be repeated here.

In the example shown in FIG. 2, because the first portion 211 of the first voltage line 21 extends along the second direction (i.e., the column direction), first voltage terminals 31 of the first row of light-emitting units 100 to the third row of light-emitting units 100 located in a same column are located within an orthogonal projection of the first voltage line 21 on the base substrate 101 (e.g., within an orthogonal projection of the first portion 211 on the base substrate 101), and therefore, with respect to the first row of light-emitting units 100 to the third row of light-emitting units 100, a via hole may be provided in a position of the first voltage terminal 31 to implement electrical connection between the first voltage terminal 31 and the first voltage line 21. The second portion 212 of the first voltage line 21 extends obliquely, and first voltage terminals 31 of the fourth row of light-emitting units 100 are located outside the orthogonal projection of the first voltage line 21 on the base substrate 101 (e.g., outside an orthogonal projection of the second portion 212 on the base substrate 101), and therefore, with respect to the fourth row of light-emitting units 100, electrical connection between the first voltage terminal 31 and the first voltage line 21 cannot be implement by providing a via hole in the position of the first voltage terminal 31, but a first transmission line 22 needs to be provided to electrical connect the first voltage terminal 31 and the first voltage line 21 with each other.

By making the first voltage line 21 start extending obliquely and be gradually narrowed from a position farther away from an edge of the light-emitting substrate 10 (e.g., a lower edge of the light-emitting substrate 10 shown in FIG. 2), not only electrical connection between the first voltage terminal 31 of the respective rows of light-emitting units 100 and the first voltage line 21 is ensured, but also an oblique wiring region can be effectively reduced to reduce the frame of the light-emitting substrate 10, thus making the width L2 of the non-display region relatively small, which helps reduce a size of the non-display region of the light-emitting substrate 10, and is favorable for implementing narrow frame design.

It should be noted that, in the example, the first transmission line 22 extends to the first connecting portion 213 along the second direction, and is electrically connected with the first connecting portion 213 through the via hole, so as to facilitate wiring of the first transmission line 22, which is favorable for simplifying layout design. However, the embodiments of the present disclosure are not limited thereto, and the first transmission line 22 may also extend in an arbitrary direction and be electrically connected with any portion (e.g., the first portion 211 or the second portion 212) of the first voltage line 21, which may be determined according to actual needs, for example, according to actual wiring design, and will not be limited by the embodiments of the present disclosure.

For example, as shown in FIG. 2, FIG. 5A and FIG. 5B, the light-emitting substrate 10 further includes a plurality of second voltage lines 23 and a plurality of second transmission lines 24. The plurality of second voltage lines 23 are in one-to-one correspondence with the plurality of columns of light-emitting units 100, and are configured to transmit the second voltage signal. For example, the second voltage signal is a common voltage signal or a driving voltage signal. It should be noted that, if the foregoing first voltage signal is a driving voltage signal, the second voltage signal is a common voltage signal, and a level of the first voltage signal is greater than a level of the second voltage signal; if the foregoing first voltage signal is a common voltage signal, the second voltage signal is a driving voltage signal, and the level of the first voltage signal is lower than the level of the second voltage signal. For example, the common voltage signal is a ground signal. The specific levels and signal types of the first voltage signal and the second voltage signal may be determined according to actual needs, for example, according to a structural form and an operation mode of the light-emitting unit 100, which will not be limited by the embodiments of the present disclosure.

For example, the second voltage line 23 includes a third portion 231, a second connecting portion 233, and a fourth portion 232 connected sequentially. For example, with respect to a same second voltage line 23, a width of the third portion 231 along the first direction is greater than a width of the fourth portion 232 along the first direction. For example, with respect to a same second voltage line 23, widths of the third portion 231 along the first direction in different positions may be equal to one another, and widths of the fourth portion 232 along the first direction in different positions may be different from each other. For example, the width of the fourth portion 232 along the first direction, for example, gradually decreases from an end connected with the second connecting portion 233 to an end connected with the bonding pin 41 (to be described later), that is, the fourth portion 232 is gradually narrowed to meet wiring design requirements.

For example, the third portion 231 extends along the second direction and is electrically connected with second voltage terminals 32 of the first row of light-emitting units 100 to the Y-th row of light-emitting units 100 in a corresponding column, for example, through a via hole to realize electrical connection. In the example of FIG. 2, the third portion 231 is electrically connected with second voltage terminals 32 of the first row of light-emitting units 100 to the third row of light-emitting units 100 in a corresponding column.

It should be noted that, the film layer where the second voltage line 23 in FIG. 2 is located is located on a side of the driving circuit 110 that is closer to the base substrate 101, so the third portion 231 of the second voltage line 23 may extend below the common voltage terminal GND of the driving circuit 110 and electrically connected with the common voltage terminal GND of the driving circuit 110 (i.e., electrically connected with the second voltage terminal 32) through the via hole, that is, the second voltage line 23 transmits the second voltage signal to the common voltage terminal GND of the driving circuit 110 (i.e., to the second voltage terminal 32). Although other terminals of the driving circuit 110 and the light-emitting element 120 overlap with the second voltage line 23 in FIG. 2, because the second voltage line 23 is located in a film layer different from the film layer where the driving circuit 110 and the light-emitting element 120 are located, the other terminals of the driving circuit 110 and the light-emitting element 120 are not electrically connected with the second voltage line 23.

An extension direction of a fourth portion 232 of at least one second voltage line 23 among the plurality of second voltage lines 23 has an included angle with both the first direction and the second direction. For example, the included angle may be greater than 0 degrees and less than 90 degrees (e.g., ranges from 20 to 70 degrees, form 40 to 60 degrees, or is 45 degrees); and the included angle between the extension direction and the first direction and the included angle between the extension direction and the second direction may be the same or different. For example, in the example of FIG. 2, a fourth portion 232 of at least one second voltage line 23 extends obliquely, that is, has an included angle with both the row direction and the column direction. It should be noted that, it may be that fourth portions 232 of some of the second voltage lines 23 extend obliquely, or fourth portions 232 of all the second voltage lines 23 extend obliquely, which may be determined according to actual wiring requirements, and is not limited by the embodiments of the present disclosure.

The second connecting portion 233 is located at a boundary between the Y-th row of light-emitting units 100 and the (Y+1)-th row of light-emitting units 100, and is configured to allow the third portion 231 to be electrically connected to the fourth portion 232, 0<Y<N and Y is an integer. For example, in the example of FIG. 2, the second connecting portion 233 is located at a boundary of the third row of light-emitting units 100 and the fourth row of light-emitting units 100, and in this case, Y=3, N=4, and Y=N-1. For example, the second connecting portion 233 is actually a bent portion of the second voltage line 23, so that the extension direction of the second voltage line 23 is changed. It should be noted that, a region covered by the second connecting portion 233 is not limited; and the second connecting portion 233 may not only include the bent portion of the second voltage line 23, but may also include a portion of a line segment of the second voltage line 23 that extends in the second direction, or may also include a portion of an obliquely extending line segment of the second voltage line 23, which is not limited by the embodiments of the present disclosure.

The plurality of second transmission lines 24 are in one-to-one correspondence with the plurality of columns of light-emitting units 100. The second transmission line 24 is electrically connected with second voltage terminals 32 of the (Y+1)-th row of light-emitting units 100 to the N-th row of light-emitting units 100 in the corresponding column, and is electrically connected with the second connecting portion 233 of the second voltage line 23 corresponding to the light-emitting units 100 in the corresponding column. For example, in the example of FIG. 2, the second transmission line 24 is electrically connected with second voltage terminals 32 of the fourth row of light-emitting units 100 of the corresponding column, and is electrically connected with the second connecting portion 233 of the second voltage line 23 corresponding to the light-emitting units 100 in the corresponding column, so that the second voltage terminals 32 of the fourth row of light-emitting units 100 are electrically connected with the second voltage line 23, so as to receive the second voltage signal supplied by the second voltage line 23. In this case, Y=3, N=4, and Y=N-1.

For example, the second voltage line 23 and the second transmission line 24 are located in different layers, so as to facilitate wiring. For example, electrical connection between the second voltage line 23 and the second transmission line 24 may be implemented through a via hole. Of course, the embodiments of the present disclosure are not limited thereto, and the second voltage line 23 and the second transmission line 24 may also be located in a same layer, as long as corresponding electrical connection can be implemented without short-circuiting with other structures. For example, a width of the fourth portion 232 of the second voltage line 23 in the first direction is greater than a width of the second transmission line 24 in the first direction.

For example, the first voltage line 21 and the second voltage line 23 may be located in a same layer; the first transmission line 22 and the second transmission line 24 may be located in a same layer; and the first voltage line 21 and the first transmission line 22 may be located in different layers. Thus, the first voltage line 21, the second voltage line 23, the first transmission line 22, and the second transmission line 24 may be arranged by using two film layers; the first voltage line 21 and the second voltage line 23 are located in one of the film layers, and the first transmission line 22 and the second transmission line 24 are located in the other film layer, so that the process may be simplified and a short circuit may be avoided.

In the example shown in FIG. 2, because the third portion 231 of the second voltage line 23 extends along the second direction (i.e., the column direction), the second voltage terminals 32 of the first row of light-emitting units 100 to the third row of light-emitting units 100 located in a same column are located within an orthogonal projection of the second voltage line 23 on the base substrate 101 (e.g., within an orthogonal projection of the third portion 231 on the base substrate 101), and therefore, with respect to the first row of light-emitting units 100 to the third row of light-emitting units 100, electrical connection between the second voltage terminal 32 and the second voltage line 23 may be implemented by arranging a via hole in the position of the second voltage terminal 32. The fourth portion 232 of the second voltage line 23 extends obliquely, the second voltage terminals 32 of the fourth row of light-emitting units 100 are located outside the orthogonal projection of the second voltage line 23 on the base substrate 101 (e.g., located outside an orthogonal projection of the fourth portion 232 on the base substrate 101), and therefore, with respect to the fourth row of light-emitting units 100, electrical connection between the second voltage terminal 32 and the second voltage line 23 cannot be implemented by arranging a via hole in the position of the second voltage terminal 32; instead, a second transmission line 24 needs to be arranged to realize the electrical connection between the second voltage terminal 32 and the second voltage line 23.

By making the second voltage line 23 start extending obliquely and be gradually narrowed from a position farther away from the edge of the light-emitting substrate 10 (e.g., the lower edge of the light-emitting substrate 10 shown in FIG. 2), not only electrical connection between the second voltage terminals 32 of the respective rows of light-emitting units 100 and the second voltage line 23 is ensured, but also an oblique wiring region can be effectively reduced to reduce the frame of the light-emitting substrate 10, thus making the width L2 of the non-display region respectively small, which helps reduce a size of the non-display region of the light-emitting substrate 10, and is favorable for implementing narrow frame design.

It should be noted that, in the example, the second transmission line 24 extends to the second connecting portion 233 along the second direction, and is electrically connected with the second connecting portion 233 through the via hole, so as to facilitate wiring of the second transmission line 24 which is favorable for simplifying layout design. However, the embodiments of the present disclosure are not limited thereto, and the second transmission line 24 may also extend in an arbitrary direction and be electrically connected with any portion (e.g., the third portion 231 or the fourth portion 232) of the second voltage line 23, which may be determined according to actual needs, for example, according to actual wiring design, and will not be limited by the embodiments of the present disclosure.

It should be noted that, in the embodiments of the present disclosure, Y may be equal to N-1, or may also be equal to N-2, or may also be other numerical value, which is not limited by the embodiments of the present disclosure. In the case where Y=N-1, the first voltage line 21 and the second voltage line 23 start extending obliquely from a boundary between the last row of light-emitting units 100 and the second-to-last row of light-emitting units 100. In the case where Y=N-2, the first voltage line 21 and the second voltage line 23 start extending obliquely from a boundary between the second-to-last row of light-emitting units 100 and the third-to-last row of light-emitting units 100. In the case where Y is equal to other numerical value, the first voltage line 21 and the second voltage line 23 may start extending obliquely from a position further away from the edge of the light-emitting substrate 10 (e.g., the lower edge of the light-emitting substrate 10 shown in FIG. 2). Therefore, the extending manner of the first voltage line 21 and the second voltage line 23 may be adjusted according to actual wiring requirements of the light-emitting substrate 10, so as to implement narrow frame design.

It should be noted that, in the embodiments of the present disclosure, only the first voltage line 21 may adopt the above-described wiring mode (i.e., staring extending obliquely from the boundary between the Y-th row of light-emitting units 100 and the (Y+1)-th row of light-emitting units 100); or, only the second voltage line 23 may adopt the above-described wiring mode (i.e., starting extending obliquely from the boundary between the Y-th row of light-emitting units 100 and the (Y+1)-th row of light-emitting units 100); or, the first voltage line 21 and the second voltage line 23 may both adopt the above-described wiring mode, which is not limited by the embodiments of the present disclosure. For example, in the case where both the first voltage line 21 and the second voltage line 23 adopt the above-described wiring mode, the position where the first voltage line 21 starts to extend obliquely and the position where the second voltage line 23 starts to extend obliquely may be the same or different. That is, the Y value corresponding to the first voltage line 21 and the Y value corresponding to the second voltage line 23 may be the same or different, which is not limited by the embodiments of the present disclosure.

It should be noted that, in the light-emitting substrate 10 shown in FIG. 2, a width of the first voltage line 21 along the first direction is different from a width of the second voltage line 23 along the first direction, the first voltage line 21 is narrower, and the second voltage line 23 is wider, which is only for the purpose of distinguishing the first voltage line 21 and the second voltage line 23 more clearly in FIG. 2, and should not be construed as a limitation on the embodiments of the present disclosure. The first voltage line 21 and the second voltage line 23 may have the same or substantially the same width; and the width of the first voltage line 21 may also be greater or less than the width of the second voltage line 23, which may be determined according to actual needs, and is not limited by the embodiments of the present disclosure.

It should be noted that, in the embodiments of the present disclosure, at least one first transmission line 22 among the plurality of first transmission lines 22 extends along the second direction, that is, it may be that only one first transmission line 22 extends along the second direction, or some of the first transmission lines 22 extend along the second direction, or all the first transmission lines 22 extend along the second direction, which may be determined according to actual wiring requirements, and is not limited by the embodiments of the present disclosure. Similarly, at least one second transmission line 24 among the plurality of second transmission lines 24 extends along the second direction, that is, it may be that only one second transmission line 24 extends along the second direction, or some second transmission lines 24 extend along the second direction, or all the second transmission lines 24 extend along the second direction, which may be determined according to actual wiring requirements, and is not limited by the embodiments of the present disclosure. By making the first transmission line 22 and the second transmission line 24 extend along the second direction, the lengths of the first transmission line 22 and the second transmission line 24 may be shortened, thereby reducing transmission resistance.

For example, as shown in FIG. 2, the light-emitting substrate 10 further includes a bonding region BR; the bonding region BR is located at the edge of the light-emitting substrate 10 that is close to the N-th row of light-emitting units 100, for example, the lower edge of the light-emitting substrate 10 shown in FIG. 2. The bonding region BR includes a plurality of bonding pins 41; the second portion 212 of the first voltage line 21 is electrically connected (e.g., directly electrically connected) with at least one of the plurality of bonding pins 41; and the fourth portion 232 of the second voltage line 23 is electrically connected (e.g., directly electrically connected) with at least one of the plurality of bonding pins 41. For example, the second portion 212 of each first voltage line 21 may be electrically connected with one or more bonding pins 41, and similarly, the fourth portion 232 of each second voltage line 23 may also be electrically connected with one or more bonding pins 41. A same first voltage line 21 is electrically connected with a plurality of bonding pins 41 or a same second voltage line 23 is electrically connected with a plurality of bonding pins 41, which can improve connection reliability and reduce transmission resistance. The bonding pins 41 in the bonding region BR may be electrically connected with a separately provided control circuit or chip through a flexible circuit board, so as to facilitate receiving the first voltage signal and the second voltage signal transmitted by the control circuit or chip, and transmitting the first voltage signal and the second voltage signal to the first voltage line 21 and the second voltage line 23.

It should be noted that, in the embodiments of the present disclosure, within the bonding region BR, the portion of the first voltage line 21 that is connected with the bonding pin 41 is not limited to the mode shown in FIG. 2, or may also be the mode shown in FIG. 1B, that is, the first voltage line 21 turns to extend along the second direction in a region close to the bonding pin 41 and is electrically connected with the bonding pin 41, in which case, the second portion 212 of the first voltage line 21 is electrically connected with the bonding pin 41 through a pin connecting portion; and the pin connecting portion is, for example, a portion of the first voltage line 21 that is directly electrically connected with the bonding pin 41 and extends along the second direction. Similarly, the portion of the second voltage line 23 that is connected with the bonding pin 41 is not limited to the mode shown in FIG. 2, or may also be the mode shown in FIG. 1B, that is, the second voltage line 23 turns to extend along the second direction in a region close to the bonding pin 41 and is electrically connected with the bonding pin 41, in which case, the fourth portion 232 of the second voltage line 23 is electrically connected with the bonding pin 41 through a pin connecting portion; and the pin connecting portion is, for example, a portion of the second voltage line 23 that is directly electrically connected with the bonding pin 41 and extends along the second direction.

For example, as shown in FIG. 2, the light-emitting substrate 10 further includes a plurality of address adapter lines 130; and the plurality of address adapter lines 130 extend along the first direction and are configured to transmit a first input signal.

For example, the plurality of light-emitting units 100 in the light-emitting substrate 10 are arranged in N rows and M columns and are divided into a plurality of groups; each group of light-emitting units 100 includes a total of X*M light-emitting units 100 arranged in X rows and M columns; and the plurality of address adapter lines 130 are in one-to-one correspondence with the plurality of groups of light-emitting units 100. In this case, the light-emitting units 100 are divided into N/X groups. For example, in the example shown in FIG. 2, each group of light-emitting units 100 includes a total of 10 light-emitting units 100 arranged in 2 rows and 5 columns, so every 2 rows of light-emitting units 100 correspond to one address adapter line 130, and the amount of address adapter lines 130 in the light-emitting substrate 10 is N/2. For example, 0<X≤N and X is an integer.

Figure 6A:
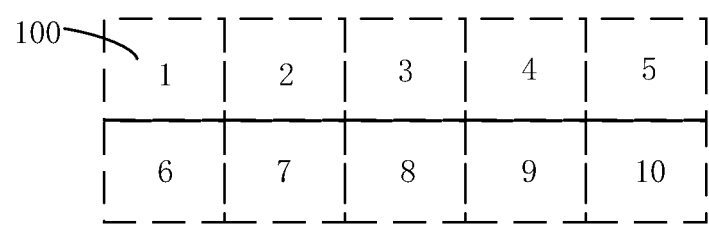
FIG. 6A and FIG. 6B are schematic diagrams of numbering modes of light-emitting units of a light-emitting substrate provided by some embodiments of the present disclosure.
Figure 6B:
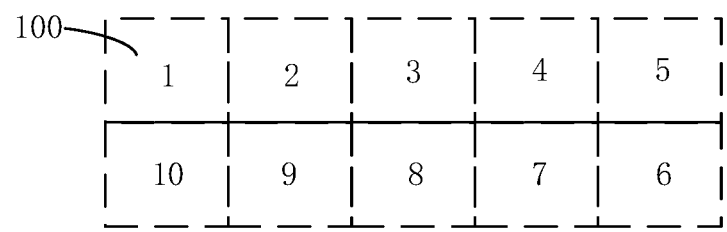

For example, in a same group of light-emitting units 100, X*M light-emitting units 100 are sequentially numbered according to row and column distribution positions. For example, in some examples, as shown in FIG. 6A, the X*M light-emitting units are sequentially numbered row by row and column by column in a Z shape; each rectangle in FIG. 6A represents one light-emitting unit 100; and numbers of the respective light-emitting units 100 are marked in respective rectangles. For example, in other examples, as shown in FIG. 6B, the X*M light-emitting units are sequentially numbered row by row and column by column in an S shape; similarly, each rectangle in FIG. 6B represents one light-emitting unit 100, and numbers of the respective light-emitting units 100 are marked in respective rectangles. It should be noted that, the mode of sequentially numbering the light-emitting units 100 according to the row and column distribution positions is not limited to the mode as described above, or may also be other numbering mode, so that connection modes of the plurality of light-emitting units 100 may be flexibly adjusted, which is not limited by the embodiments of the present disclosure.

For example, as shown in FIG. 2 and FIG. 4, in a same group of light-emitting units 100, a first input terminal Di of a driving circuit 110 of a light-emitting unit 100 numbered 1 is electrically connected with an address adapter line 130 corresponding to the group of light-emitting units 100; an output terminal OT of a driving circuit 110 of a light-emitting unit 100 numbered P is electrically connected with a first input terminal Di of a driving circuit 110 of a light-emitting unit 100 numbered P+1; and the first input terminal Di of the driving circuit of the light-emitting unit 100 numbered P+1 receives a relay signal output by the output terminal OT of the driving circuit 110 of the light-emitting unit 100 numbered P as the first input signal. For example, 0<P<X*M and P is an integer.

For example, in the case where the numbering mode shown in FIG. 6A is adopted, with respect to a group of light-emitting units 100 numbered 1 (i.e., the group of light-emitting units 100 on an uppermost side of the light-emitting substrate 10, or referred to as a first group of light-emitting units 100), a first input terminal Di of a driving circuit 110 of a light-emitting units 100 located in the first row and the first column is electrically connected with an address adapter line 130 corresponding to the group of light-emitting units 100; and an output terminal OT of a driving circuit 110 of each light-emitting unit 100 is electrically connected with a first input terminal Di of a driving circuit 110 of a next light-emitting unit 100 (an output terminal OT of a driving circuit 110 of the last light-emitting unit 100 is not connected with any other driving circuit 110). With respect to a group of light-emitting units 100 numbered 2 (i.e., the group of light-emitting units 100 adjacent to the first group of light-emitting units 100, or referred to as a second group of light-emitting units 100), a first input terminal Di of a driving circuit 110 of a light-emitting unit 100 located in the third row and the first column is electrically connected with an address adapter line 130 corresponding to the group of light-emitting units 100, and an output terminal OT of a driving circuit 110 of each light-emitting unit 100 is electrically connected with a first input terminal Di of a driving circuit 110 of a next light-emitting unit 100 in a manner similar to that of the first group of light-emitting units 100.

Through the above-described connection mode, in each group of light-emitting units 100, only the first input terminal Di of the driving circuit 110 of the first light-emitting unit 100 is electrically connected with the address adapter line 130, while the first input terminal Di of the driving circuit 110 of the other light-emitting unit 100 receives a relay signal output by a driving circuit 110 of a previous light-emitting unit 100 as the first input signal. Therefore, with respect to one group of light-emitting units 100, only one address adapter line 130 is needed to provide one first input signal (i.e., the address signal), so that all light-emitting units 100 in the group of light-emitting units 100 may obtain their respective address signals, which greatly reduces the amount of signal lines, saves wiring space, and simplifies control modes.

For example, as shown in FIG. 2 and FIG. 4, the light-emitting substrate 10 further includes a plurality of voltage adapter lines 140. The plurality of voltage adapter lines 140 extend along the first direction and are configured to transmit the second input signal; and the plurality of voltage adapter lines 140 are in one-to-one correspondence with the N rows of light-emitting units 100. For example, each row of light-emitting units 100 corresponds to one voltage adapter line 140; and the amount of voltage adapter lines 140 in the light-emitting substrate 10 is N. For example, as shown in FIG. 2, the first row of light-emitting units 100, the second row of light-emitting units 100, the third row of light-emitting units 100, and the fourth row of light-emitting units 100 correspond to one voltage adapter line 140, respectively.

For example, with respect to one row of light-emitting units 100, a second input terminal Pwr of a driving circuit 110 in a light-emitting unit 100 is electrically connected with the voltage adapter line 140 corresponding to the row of the light-emitting unit 100 including the driving circuit 110. That is, the second input terminals Pwr of all the driving circuits 110 in one row of light-emitting units 10 are electrically connected with the voltage adapter line 140 corresponding to the row, so as to receive the second input signal.

For example, as shown in FIG. 2, the light-emitting substrate 10 further includes a plurality of source address lines 150 and a plurality of source voltage lines 160 extending along the second direction.

For example, the plurality of source address lines 150 are electrically connected with the plurality of address adapter lines 130 in one-to-one correspondence, and are configured to transmit the first input signal. For example, the amount of source address lines 150 is equal to the amount of address adapter lines 130, both being equal to N/X, that is, in the case where the light-emitting units 100 are divided into N/X groups, each group of light-emitting units 100 corresponds to one source address line 150 and one address adapter line 130, and the source address line 150 and the address adapter line 130 transmit the first input signal to the first light-emitting unit 100 in the group of light-emitting units 100.

For example, the plurality of source voltage lines 160 are in one-to-one correspondence with the plurality of groups of light-emitting units 100; and each source voltage line 160 is electrically connected with a plurality of voltage adapter lines 140 corresponding to a corresponding group of light-emitting units 100, and is configured to transmit the second input signal. For example, the amount of source voltage lines 160 is N/X, that is, in the case where the light-emitting units 100 are divided into N/X groups, each group of light-emitting units 100 corresponds to one source voltage line 160, and the source voltage line 160 transmits the second input signal to a plurality of voltage adapter lines 140 corresponding to the group of light-emitting units 100, so as to provide the second input signals to all the light-emitting units 100 in the group of light-emitting units 100. For example, the source address line 150 and the source voltage line 160 corresponding to a same group of light-emitting units 100 are arranged adjacent to each other, and are located in gaps of the plurality of columns of light-emitting units 100.

It should be noted that, in a same group of light-emitting units 100, second input terminals Pwr of driving circuits 110 of all light-emitting units 100 are electrically connected with corresponding voltage adapter lines 140; and these voltage adapter lines 140 are coupled to a same source voltage line 160. Therefore, with respect to a group of light-emitting units 100, only one source voltage line 160 is needed to provide one second input signal, so that all the light-emitting units 100 in the group of light-emitting units 100 may obtain the second input signal. This greatly reduces the amount of signal lines, saves wiring space, and simplifies control modes.

For example, in the light-emitting substrate 10, the amount of source address lines 150 and the amount of source voltage lines 160 are both N/X.

For example, in some examples, above the base substrate 101, the source address lines 150 are located in a same layer as the source voltage lines 160; the voltage adapter lines 140 are located in a same layer as the address adapter lines 130, and the source address lines 150 are located in a different layer from the address adapter lines 130. That is, the source address lines 150 and the source voltage lines 160 are prepared by using one patterning process (e.g., a photoetching process); the voltage adapter lines 140 and the address adapter lines 130 are prepared by using another patterning process; an insulating layer is provided between a film layer where the source address lines 150 and the source voltage lines 160 are located and a film layer where the voltage adapter lines 140 and the address adapter line 130 are located; and corresponding wirings are electrically connected with each other through via holes running through the insulating layer. Such a mode may simplify the preparation process, and may be compatible with the usual semiconductor film layer preparation process, thereby improving production efficiency.

For example, in the light-emitting substrate 10, the film layers where the first voltage line 21, the first transmission line 22, the second voltage line 23, and the second transmission line 24 are respectively located and the film layers where the address adapter line 130, the voltage adapter line 140, the source address line 150, and the source voltage line 160 are respectively located may be determined according to actual needs; and these film layers may be the same or different, which is not limited by the embodiments of the present disclosure.

Figure 7:
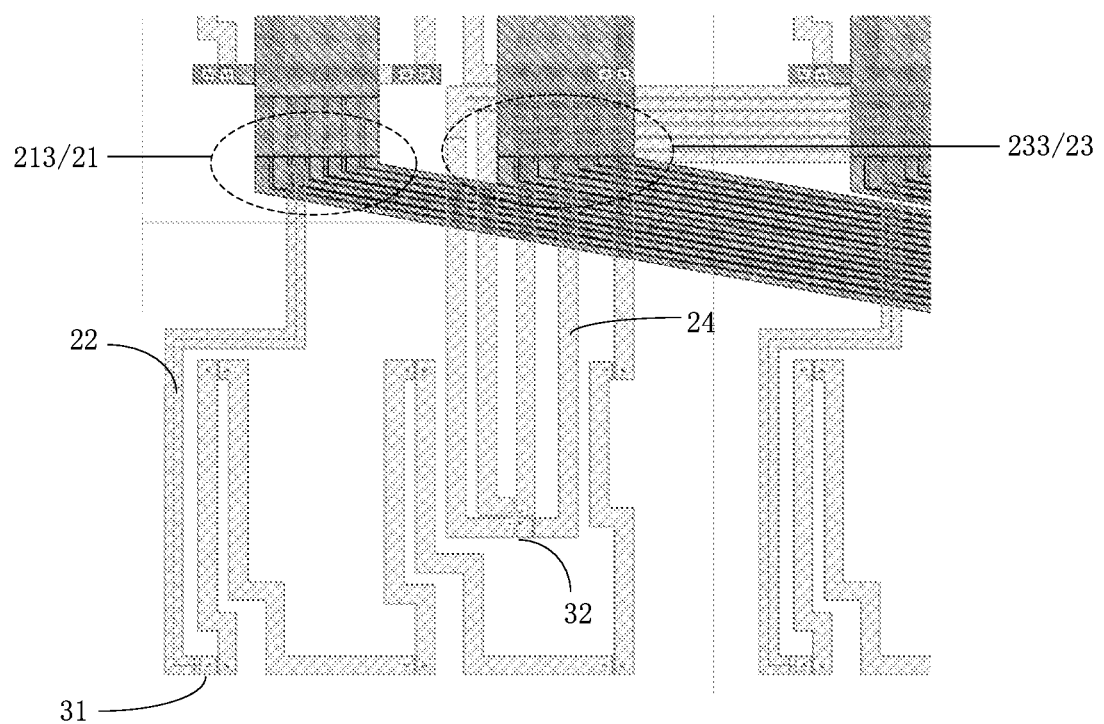
FIG. 7 is a partial schematic diagram of wiring design of a light-emitting substrate provided by some embodiments of the present disclosure.

FIG. 7 is a partial schematic diagram of wiring design of a light-emitting substrate provided by some embodiments of the present disclosure; and FIG. 7 is, for example, a schematic diagram of wiring design of the region C1 in FIG. 2. For example, as shown in FIG. 7, the first transmission line 22 is composed of a plurality of line segments (e.g., 4 line segments) connected sequentially; some of the line segments extend along the second direction, and the other of the line segments extend along the first direction, so that the first voltage terminal 31 of the light-emitting unit 100 is electrically connected with the first connecting portion 213 of the first voltage line 21. Similarly, the second transmission line 24 is composed of a plurality of line segments (e.g., 2 line segments) connected sequentially, some of the line segments extend along the second direction, and the other of the line segments extend along the first direction, so that the second voltage terminal 32 of the light-emitting unit 100 is electrically connected with the second connecting portion 233 of the second voltage line 23.

It should be noted that, in the description of the present disclosure, the first transmission line 22 extending along the second direction means that at least some of the line segments of the first transmission line 22 extend along the second direction, and does not mean that the first transmission line 22 extends strictly along the second direction. Similarly, the second transmission line 24 extending along the second direction means that at least some of the line segments of the second transmission line 24 extend along the second direction, and does not mean that the second transmission line 24 extends strictly along the second direction.

For example, as shown in FIG. 7, the second portion 212 of the first voltage line 21 starts extending obliquely from a boundary between an (N-1)-th row of light-emitting units 100 and an N-th row of light-emitting units 100; one end of the first transmission line 22 is electrically connected with the first voltage terminal 31 through a via hole; and the other end of the first transmission line 22 is electrically connected with the first connecting portion 213 of the first voltage line 21 through a via hole. Similarly, the fourth portion 232 of the second voltage line 23 starts extending obliquely from the boundary between the (N-1)-th row of light-emitting units 100 and the N-th row of light-emitting units 100; one end of the second transmission line 24 is electrically connected with the second voltage 32 through a via hole; and the other end of the second transmission line 24 is electrically connected with the second connecting portion 233 of the second voltage line 23 through a via hole.

Figure 8:
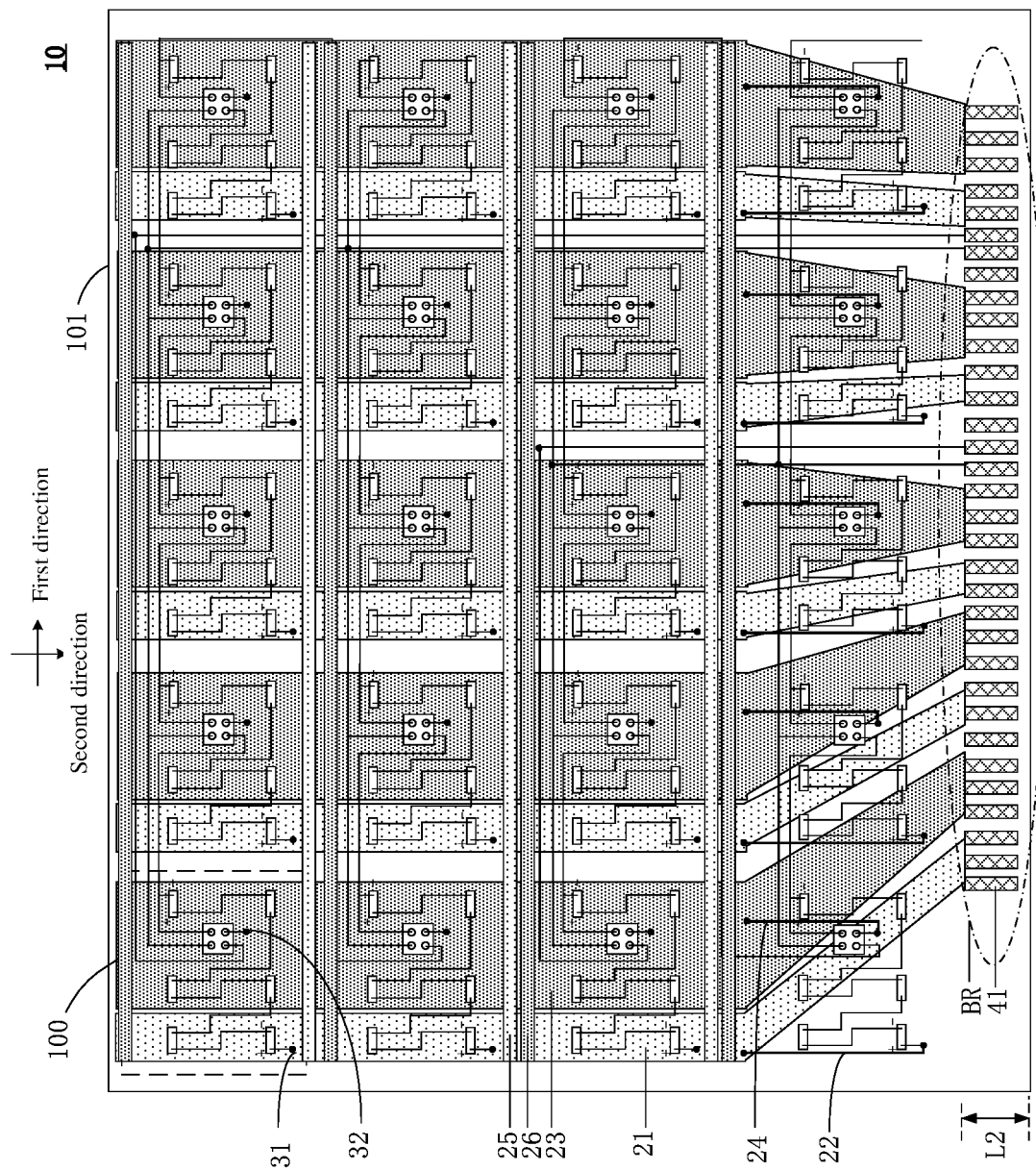
FIG. 8 is a schematic plane view of another light-emitting substrate provided by some embodiments of the present disclosure.

FIG. 8 is a schematic plane view of another light-emitting substrate provided by some embodiments of the present disclosure. For example, in some examples, as shown in FIG. 8, the light-emitting substrate 10 further includes a plurality of third voltage lines 25 and a plurality of fourth voltage lines 26 extending along the first direction. Other structures of the light-emitting substrate 10 are substantially the same as those of the light-emitting substrate 10 shown in FIG. 2, and no details will be repeated here.

For example, orthogonal projections of the plurality of third voltage lines 25 on a plane parallel to the light-emitting substrate 10 overlap with orthogonal projections of the plurality of first voltage lines 21 on the plane parallel to the light-emitting substrate 10; and the plurality of third voltage lines 25 are electrically connected with the plurality of first voltage lines 21 through via holes. For example, orthogonal projections of the plurality of fourth voltage lines 26 on the plane parallel to the light-emitting substrate 10 overlap with orthogonal projections of the plurality of second voltage lines 23 on the plane parallel to the light-emitting substrate 10; and the plurality of fourth voltage lines 26 are electrically connected with the plurality of second voltage lines 23 through via holes. For example, the plurality of third voltage lines 25 and the plurality of fourth voltage lines 26 are located in a same layer.

For example, the plurality of third voltage lines 25 are electrically connected with the plurality of first voltage lines 21 through via holes to form grid-like wirings, and the plurality of fourth voltage lines 26 are electrically connected with the plurality of second voltage lines 23 through via holes to form grid-like wirings, so that transmission resistance may be reduced, and voltage consistency in the light-emitting substrate 10 may be improved. For example, the third voltage line 25 and the fourth voltage line 26 are located in a same layer, and are located in a same layer as the address adapter line 130 and the voltage adapter line 140. Because the third voltage line 25, the fourth voltage line 26, the address adapter line 130, and the voltage adapter line 140 all extend along the first direction, the four may be arranged in a same layer without overlapping with each other, thereby simplifying the structure and simplifying the preparation process. For example, the film layer where the third voltage line 25 and the fourth voltage line 26 are located is different from the film layer where the first voltage line 21 and the second voltage line 23 are located.

It should be noted that, in the embodiments of the present disclosure, the lengths and the widths of the first voltage line 21, the second voltage line 23, the third voltage line 25, and the fourth voltage line 26 may be set to any numerical value; the lengths thereof may be the same or different, and the widths thereof may also be the same or different, which may be determined according to actual needs, and will not be limited by the embodiments of the present disclosure.

It should be noted that, in the embodiments of the present disclosure, the light-emitting substrate 10 may further include more structures and components; and arrangement modes of the respective structures and components may be determined according to actual needs, so as to implement diversified functions, which will not be limited by the embodiments of the present disclosure.

At least one embodiment of the present disclosure further provides a display device. The display device includes a display panel and the light-emitting substrate provided by any one embodiment of the present disclosure. The display device can effectively reduce the width of the non-display region and the size of the non-display region, which is favorable for implementing narrow frame design.

Figure 9:
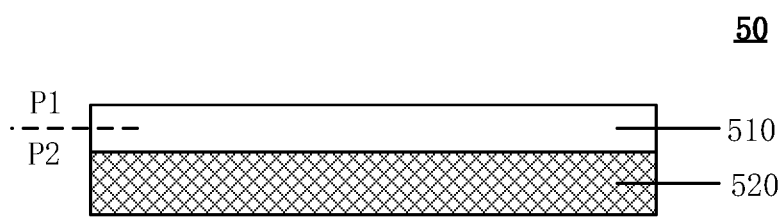
FIG. 9 is a cross-sectional schematic diagram of a display device provided by some embodiments of the present disclosure.

FIG. 9 is a cross-sectional schematic diagram of a display device provided by some embodiments of the present disclosure. For example, as shown in FIG. 9, in some embodiments, the display device 50 includes a display panel 510 and a light-emitting substrate 520. For example, the light-emitting substrate 520 may be the light-emitting substrate provided by any one embodiment of the present disclosure, for example, the foregoing light-emitting substrate 10.

For example, the display panel 510 has a display side P1 and a non-display side P2 opposite to the display side P1; and the light-emitting substrate 520 is provided on the non-display side P2 of the display panel 510 to serve as a backlight unit. For example, the light-emitting substrate 520 may provide backlight to the display panel 510 as a surface light source. For example, the display panel 510 may be an LCD panel, an electronic paper display panel, etc. which is not limited by the embodiments of the present disclosure.

For example, the display device 50 may be a LCD device, an electronic paper display device, etc., or may also be other devices having a display function, etc., which is not limited by the embodiments of the present disclosure. For example, the display device 50 may be any product or component having a display function, such as a mobile phone, a tablet personal computer, a television, a monitor, a laptop, a digital photo frame, a navigator, an E-book, etc., which is not limited by the embodiments of the present disclosure.

It should be noted that, the light-emitting substrate 10 provided by the embodiments of the present disclosure not only may be applied to the above-described display device 50 as a backlight unit, but also may be used separately as a substrate having a display function or a light-emitting function, which is not limited by the embodiments of the present disclosure.

The above description of the light-emitting substrate 10 may be referred to for detailed description and technical effects of the display device 50, and no details are repeated here. The display device 50 may further include more components and structures, which may be determined according to actual needs, and are not limited by the embodiments of the present disclosure.

The following is to be noted.

(1) The drawings of the present disclosure only relate to the structures relevant to the embodiments of the present disclosure, and other structures may be referred to the common design.

(2) In the case of no conflict, the embodiments of the present disclosure and the features of the embodiments may be combined with each other to obtain new embodiments.

What have been described above are only specific implementations of the present disclosure, the protection scope of the present disclosure is not limited thereto, and the protection scope of the present disclosure should be based on the protection scope of the claims.

What is claimed is:

1. A light-emitting substrate, comprising a plurality of light-emitting units, a plurality of first voltage lines, and a plurality of first transmission lines,
    wherein the plurality of light-emitting units are arranged in an N*M array with N rows and M columns along the first direction and the second direction, the first direction and the second direction intersect with each other, and each of the plurality of light-emitting units comprises a first voltage terminal;
    the plurality of first voltage lines are in one-to-one correspondence with a plurality of columns of light-emitting units, and are configured to transmit a first voltage signal, and a first voltage line of the plurality of first voltage lines comprises a first portion, a first connecting portion, and a second portion connected sequentially;
    the first portion extends along the second direction and is electrically connected with first voltage terminals of a first row of light-emitting units to a Y-th row of light-emitting units in a corresponding column;
    an extension direction of a second portion of at least one first voltage line among the plurality of first voltage lines has an included angle with both the first direction and the second direction;
    the first connecting portion is at a boundary of the Y-th row of light-emitting units and a (Y+1)-th row of light-emitting units, and is configured to allow the first portion to be electrically connected to the second portion;

the plurality of first transmission lines are in one-to-one correspondence with the plurality of columns of light-emitting units, a first transmission line of the plurality of first transmission lines is electrically connected with first voltage terminals of the (Y+1)-th row of light-emitting units to an N-th row of light-emitting units in a corresponding column, and is electrically connected with the first connecting portion of the first voltage line corresponding to light-emitting units of a corresponding column; and N is an integer greater than 0, M is an integer greater than 0, and O<Y<N and Y is an integer.

2. The light-emitting substrate according to claim 1, further comprising a plurality of second voltage lines and a plurality of second transmission lines, wherein each of the plurality of light-emitting units further comprises a second voltage terminal, the plurality of second voltage lines are in one-to-one correspondence with the plurality of columns of light-emitting units, and are configured to transmit a second voltage signal, a second voltage line of the plurality of second voltage lines comprises a third portion, a second connecting portion, and a fourth portion connected sequentially, the third portion extends along the second direction and is electrically connected with second voltage terminals of the first row of light-emitting units to the Y-th row of light-emitting units in the corresponding column, an extension direction of a fourth portion of at least one second voltage line among the plurality of second voltage lines has an included angle with both the first direction and the second direction, the second connecting portion is at a boundary between the Y-th row of light-emitting units and the (Y+1)-th row of light-emitting units, and is configured to allow the third portion to be electrically connected to the fourth portion, the plurality of second transmission lines are in one-to-one correspondence with the plurality of columns of light-emitting units, a second transmission line of the plurality of second transmission lines is electrically connected with second voltage terminals of the (Y+1)-th row of light-emitting units to the N-th row of light-emitting units in the corresponding column, and is electrically connected with the second connecting portion of the second voltage line corresponding to light-emitting units of a corresponding column.

3. The light-emitting substrate according to claim 2, wherein the second voltage line and the second transmission line are in different film layers, and the different film layers are insulated from each other in positions where there is no via hole provided.

4. The light-emitting substrate according to claim 3, wherein the first voltage line and the second voltage line are in a same layer, and the first transmission line and the second transmission line are in a same layer.

5. The light-emitting substrate according to claim 3, wherein the first voltage signal is a driving voltage signal, the second voltage signal is a common voltage signal, and a level of the first voltage signal is greater than a level of the second voltage signal; or the first voltage signal is the common voltage signal, the second voltage signal is the driving voltage signal, and the level of the first voltage signal is lower than the level of the second voltage signal.

6. The light-emitting substrate according to claim 3, further comprising a bonding region, wherein the bonding region is at an edge of the light-emitting substrate that is close to the N-th row of light-emitting units, the bonding region comprises a plurality of bonding pins, the second portion of the first voltage line is electrically connected with at least one of the plurality of bonding pins, and the fourth portion of the second voltage line is electrically connected with at least one of the plurality of bonding pins.

7. The light-emitting substrate according to claim 2, wherein the first voltage line and the second voltage line are in a same layer, and the first transmission line and the second transmission line are in a same layer.

8. The light-emitting substrate according to claim 2, wherein the first voltage signal is a driving voltage signal, the second voltage signal is a common voltage signal, and a level of the first voltage signal is greater than a level of the second voltage signal; or the first voltage signal is the common voltage signal, the second voltage signal is the driving voltage signal, and the level of the first voltage signal is lower than the level of the second voltage signal.

9. The light-emitting substrate according to claim 2, further comprising a bonding region, wherein the bonding region is at an edge of the light-emitting substrate that is close to the N-th row of light-emitting units, the bonding region comprises a plurality of bonding pins, the second portion of the first voltage line is electrically connected with at least one of the plurality of bonding pins, and the fourth portion of the second voltage line is electrically connected with at least one of the plurality of bonding pins.

10. The light-emitting substrate according to claim 2, wherein a width of the first portion of the first voltage line in the first direction is greater than a width of the first transmission line in the first direction, a width of the fourth portion of the second voltage line in the first direction is greater than a width of the second transmission line in the first direction.

11. The light-emitting substrate according to claim 2, wherein at least one first transmission line among the plurality of first transmission lines extends along the second direction, and at least one second transmission line among the plurality of second transmission lines extends along the second direction.

12. The light-emitting substrate according to claim 2, further comprising a plurality of third voltage lines and a plurality of fourth voltage lines extending along the first direction, wherein orthogonal projections of the plurality of third voltage lines on a plane parallel to the light-emitting substrate overlap with orthogonal projections of the plurality of first voltage lines on the plane parallel to the light-emitting substrate, and the plurality of third voltage lines are electrically connected with the plurality of first voltage lines through via holes;

orthogonal projections of the plurality of fourth voltage lines on the plane parallel to the light-emitting substrate overlap with orthogonal projections of the plurality of second voltage lines on the plane parallel to the light-emitting substrate, and the plurality of fourth voltage lines are electrically connected with the plurality of second voltage lines through via holes; and the plurality of third voltage lines and the plurality of fourth voltage lines are in a same layer.

13. The light-emitting substrate according to claim 2, wherein each of the plurality of light-emitting units further comprises a driving circuit and a plurality of light-emitting elements;
- the driving circuit comprises a first input terminal, a second input terminal, an output terminal, and a common voltage terminal; the common voltage terminal is electrically connected with the second voltage terminal;
- the plurality of light-emitting elements are connected in series sequentially and are connected between the first voltage terminal and the output terminal; and
- the driving circuit is configured to output a relay signal through the output terminal within a first period according to a first input signal received by the first input terminal and a second input signal received by the second input terminal, and provide a driving signal to the plurality of light-emitting elements sequentially connected in series through the output terminal within a second period.

14. The light-emitting substrate according to claim 13, wherein the plurality of light-emitting elements comprise a plurality of micro light-emitting diodes.

15. The light-emitting, substrate according to claim 2, wherein Y=N−1 or Y=N−2.

16. The light-emitting substrate to claim 2, wherein the first voltage line and the first transmission line are in different film layers, and the different film layers are insulated from each other in positions where there is no via hole provided.

17. The light-emitting substrate according to claim 1, wherein Y=N−1 or Y=N−2.

18. The light-emitting substrate according to claim 17, wherein the first voltage line and the first transmission line are in different film lavers, and the different film layers are insulated from each other in positions where there is no via hole provided.

19. The light-emitting substrate according to claim 1, wherein the first voltage line and the first transmission line are in different film layers, and the different film layers are insulated from each other in positions where there is no via hole provided.

20. A display device, comprising:
- a display panel; and
- the light-emitting substrate according to claim 1,
  wherein the display panel has a display side and a non-display side opposite to the display side, and the light-emitting substrate is on the non-display side of the display panel to serve as a backlight unit.

* * * * *